United States Patent [19]
Hsieh et al.

[11] Patent Number: 5,482,876
[45] Date of Patent: Jan. 9, 1996

[54] FIELD EFFECT TRANSISTOR WITHOUT SPACER MASK EDGE DEFECTS

[75] Inventors: Yong-Fen Hsieh; Shu-Ying Lu; Wen-Ching Tsai, all of Hsinchu, Taiwan

[73] Assignee: United MicroElectronics Corporation, Hsinchu, Taiwan

[21] Appl. No.: 450,266

[22] Filed: May 25, 1995

[51] Int. Cl.$^6$ .................................................. H01L 21/265
[52] U.S. Cl. .................................. 437/40; 437/41; 437/44; 437/952; 437/29
[58] Field of Search .......................... 437/40 SW, 41 SW, 437/40 AS, 40 R, 41 RLD, 41 AS, 44, 157, 158, 952, 29

[56] References Cited

U.S. PATENT DOCUMENTS

| | | | |
|---|---|---|---|
| 4,956,307 | 9/1990 | Pollack et al. | 437/40 SW |
| 4,981,810 | 1/1991 | Fazan et al. | 437/41 SW |
| 5,045,486 | 9/1991 | Chittipeddi et al. | 437/40 SW |
| 5,089,432 | 2/1992 | Yoo | 437/40 SW |
| 5,322,810 | 6/1994 | Ayukawa et al. | 437/41 SW |
| 5,420,079 | 5/1995 | Onishi et al. | 437/41 SW |

FOREIGN PATENT DOCUMENTS

| | | | |
|---|---|---|---|
| 1179455 | 7/1989 | Japan | 437/41 SW |
| 2165637 | 6/1990 | Japan | 437/40 SW |

OTHER PUBLICATIONS

"Defect Formation in Silicon at a Mask Edge During Crystallization of an Amorphous Implantation Layer" 66 J Applied Physics (10) 4723 (1989) Nov.

"Mask Size Defects of Lattice Defects Generated by B— and As Implantation Into Submicron Si Areas" Nuclear Instr. & Methods in Physics Research B37138 329 (1989).

"Three–Dimensional Solid–Phase–Epitaxial Regrowth From As$^+$–Implanted Si" 65 J. Appl. Physics (6) p. 2238 (1989) Mar.

Primary Examiner—Brian E. Hearn
Assistant Examiner—Kevin M. Picardat
Attorney, Agent, or Firm—George O. Saile; Alek Szecsy

[57] ABSTRACT

A field effect transistor which is not susceptible to mask edge defects at its gate spacer oxides. The transistor is formed upon a (100) silicon semiconductor substrate through successive layering of a gate oxide, and a gate electrode. A pair of gate spacer oxides is then formed covering opposite edges of the gate oxide and the gate electrode. A screen oxide is then formed over the surface of the semiconductor substrate, the gate and the gate spacer oxides. The upper surface of the screen oxide has an angle of elevation not exceeding 54.44 degrees with respect to the semiconductor substrate. The screen oxide also smoothly flows from thicker regions at the junctures of the gate spacer oxides and the semiconductor substrate to thinner regions over the surface of the semiconductor substrate. The semiconductor substrate adjoining the gate spacer oxides is then ion implanted through the screen oxide to form amorphous source/drain electrodes. The penetration depth of the ion implant is greater than the thickness of the thinner regions of the screen oxide and no greater than the thickness of the thicker regions of the screen oxide. Finally, the amorphous source/drain electrodes are annealed. In a second embodiment, a dopes glass screen layer is used in place of the screen oxide layer. The glass layer must be removed prior to annealing the amorphous source/drain electrodes.

18 Claims, 5 Drawing Sheets

FIELD EFFECT TRANSISTOR WITHOUT SPACER MASK EDGE DEFECTS

BACKGROUND OF THE INVENTION

1. Field of the Invention

The present invention relates to a method for forming a field effect transistor upon a (100) silicon semiconductor substrate in a fashion whereby the completed transistor does not exhibit mask edge defects adjoining its gate spacer oxides. More particularly, the present invention relates to a method for implanting ions through a screening layer of varying thickness to form amorphous source/drain electrodes adjoining transistor gate spacer oxides, which amorphous source/drain electrodes when recrystallized will not exhibit mask edge defects at their junctures with the gate spacer oxides.

2. Description of Related Art

With the advent of advanced generations of semiconductor transistor technology, such as Very Large Scale Integrated (VLSI) circuit technology and Ultra Large Scale Integrated (ULSI) circuit technology, there is a substantial and continuing interest in understanding the sources and control of defects which contribute to semiconductor functionality and reliability losses. Such defects may arise from several sources. Typical defect sources include semiconductor manufacturing environments, manufacturing processes, process tooling and materials.

With regard to defects whose sources derive from manufacturing processes and materials, it is well known in the art that several types of defects may be formed through the process of implanting dopant ions into semiconductor substrates to form active semiconductor regions. It is also well known that the high ion implant doses required for formation of many advanced semiconductor circuit components simultaneously make amorphous the crystalline silicon semiconductor substrate into which the dopant ions are implanted. Upon subsequent annealing to recrystallize the amorphous region, latent defects are formed or appear at locations within or adjoining the recrystallized region.

Defects which are incident to annealing and recrystallization of amorphous ion implanted semiconductor substrates fall into three categories. The first two categories are Projected Range Defects (PRDs) and End of Range Defects (ERDs). These defects appear as dislocation loops within the depth of a semiconductor substrate which has been ion implanted and recrystallized. The location and density of these defects derives from the energy and dose of the implanting ions which caused the initial crystalline to amorphous transition of the semiconductor substrate.

The third category of defect related to recrystallization of a silicon semiconductor substrate made amorphous through ion implantation is the Mask Edge Defects (MEDs). In contrast to PRDs and ERDs, MEDs are defects typically localized to the surface of the recrystallized semiconductor substrate. In particular, MEDs are formed at locations where a recrystallizing silicon substrate surface adjoins another structure on the surface of the silicon substrate. A common structure adjoining which an MED may be formed is a gate spacer oxide structure. Gate spacer oxides are formed to insulate the gate electrode edge surfaces from the adjoining source/drain electrodes in field effect transistor structures. When formed in this location, an MED is commonly referred to as a gate spacer MED. It is towards the elimination of these gate spacer MEDs that the present invention is directed.

Figure 1A:
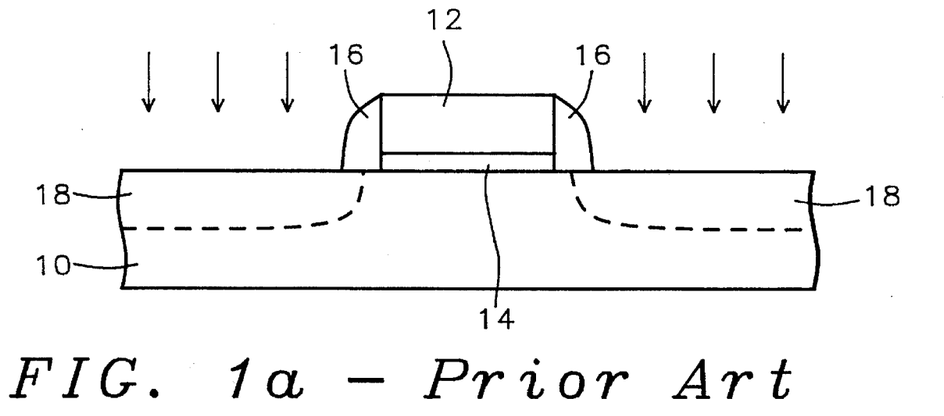
FIG. 1a and FIG. 1b show cross-sectional schematic diagrams of conventional field effect transistors of the prior art without screen oxide layers showing the formation of spacer mask edge defects.
Figure 1B:
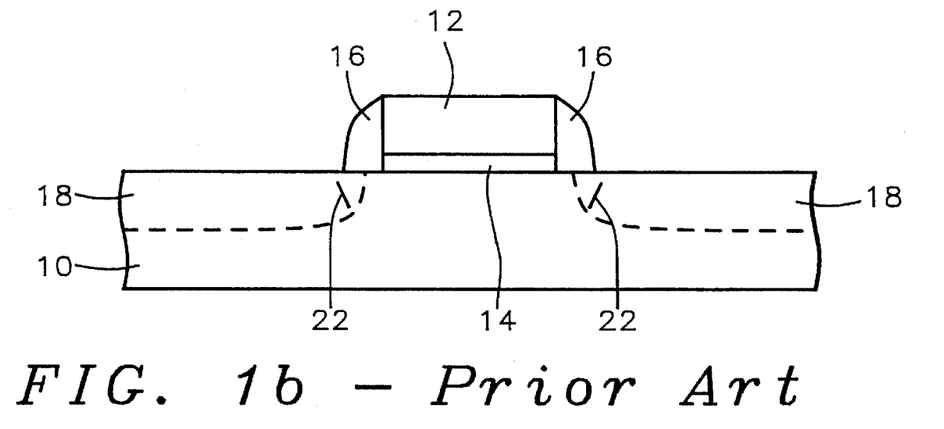
Figure 2A:
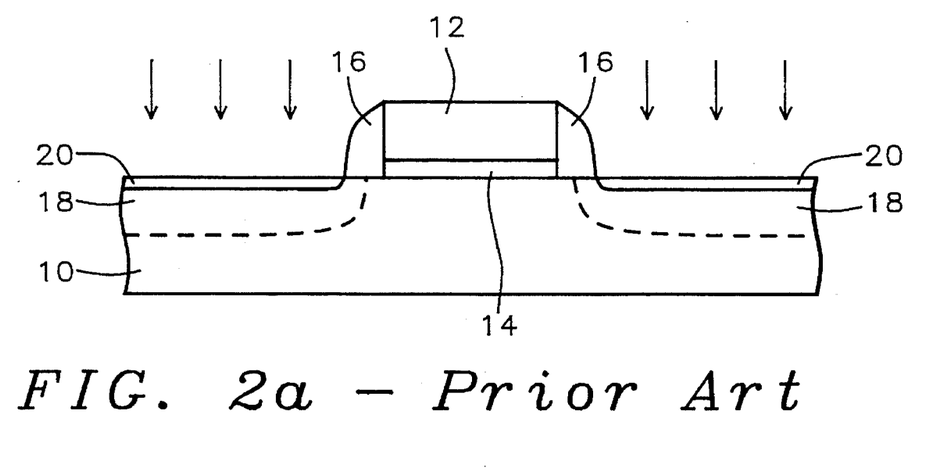
FIG. 2a and FIG. 2b show cross-sectional schematic diagrams of conventional field effect transistors of the prior art with screen oxide layers showing the formation of spacer mask edge defects.
Figure 2B:
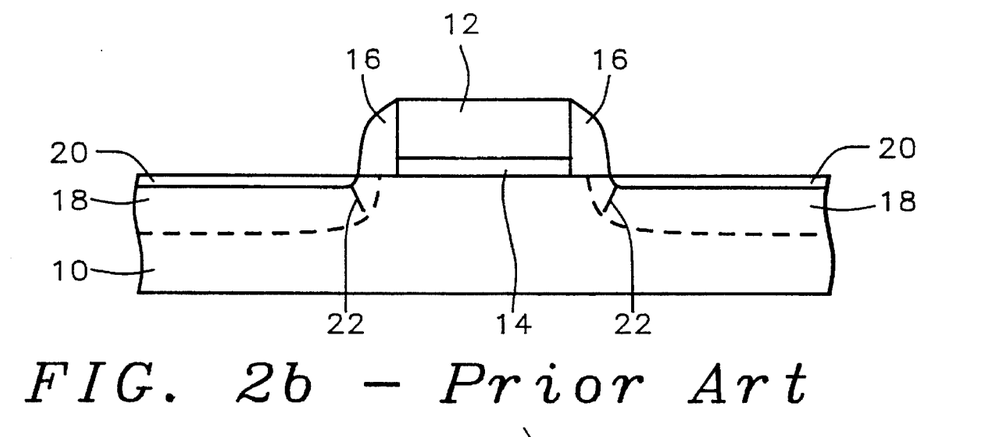

Schematic diagrams which illustrate the formation of gate spacer MEDs are shown in FIG. 1a, FIG. 1b, FIG. 2a and FIG. 2b. FIG. 1a and FIG. 1b. show the formation of gate spacer MEDs within a field effect transistor structure which possesses no screen oxide layer. FIG. 2a and FIG. 2b show the formation of gate spacer MEDs within an analogous field effect transistor structure having a screen oxide through which source/drain electrodes are ion implanted.

In FIG. 1a, FIG. 1b, FIG. 2a and FIG. 2b, a semiconductor substrate 10 has formed upon its surface a gate electrode 12 which is separated from the semiconductor substrate 10 by a gate oxide 14. On opposite sides of the gate electrode 12 and the gate oxide 14 are formed gate spacer oxides 16 which insulate the gate electrode 12 from source/drain electrodes 18. The source/drain electrodes 18 in FIG. 1a and FIG. 2a are made amorphous through a high dose ion implant. The field effect transistor structures of FIG. 2a and FIG. 2b additionally illustrate a pair of screen oxide layers 20 which absorb some of the damage of the high dose implanting ions which form the source/drain electrodes 18. FIG. 1b and FIG. 2b show the formation of gate spacer mask edge defects 22 within the semiconductor substrate 10 at the juncture with the gate spacer oxides 16 when the amorphous source/drain electrodes 18 of FIG. 1a and FIG. 2a are recrystallized.

The presence and the mechanism of formation of MEDs has been discussed in the art. For example, Cerva and Kusters, "Defect Formation in Silicon at a Mask Edge During Crystallization of an Amorphous Implantation Layer," 66 J. Appl. Physics (10) 4723 (1989) discuss the role of silicon substrate crystallographic planes upon defects formation when arsenic implanted amorphous silicon semiconductor substrates are recrystallized. From their observations, Cerva and Kusters conclude that mask edge type defects are an inevitable consequence of recrystallization of amorphous silicon semiconductor areas which have sharply curved geometries.

Consistent with the observations of Cerva and Kusters, Tamura, et al. "Mask Size Defects of Lattice Defects Generated by B- and As-Implantation Into Submicron Si Areas," Nuclear Instr. and Methods in Phys. Research B37/38 329 (1989) also discuss mask edge defects formation for submicron arsenic ion implantation into silicon semiconductor substrates. Tamura, et al. observed that when teardrop shaped amorphous regions are formed under mask edges, MEDs were formed under those mask edges after annealing those amorphous regions.

Amplifying the disclosure of Tamura, et al. is the disclosure of Horiuchi, et al., "Three-Dimensional Solid-Phase-Epitaxial Regrowth From As+—Implanted Si," 65 J. Appl. Phys. (6) 2238 (1989). Horiuchi, et al. further discuss the mechanisms associated with the formation of MEDs in silicon substrates implanted with arsenic ions. Horiuchi, et al. also observed that differences in applied stress due to differences in mask material have little effect upon MED formation at the edges of those masks. Rather, the substrate orientation and mask pattern direction play key roles in MED formation. Horiuchi, et al. also demonstrate that providing arc shaped corners to amorphous ion implanted areas on a (100) silicon wafer with a (110) mask pattern direction will eliminate mask edge defects when the amorphous ion implanted areas of that wafer are annealed and recrystallized.

Thus, the prior art illustrates both the existence of mask edge defects in arsenic implanted amorphous silicon semiconductor substrates and a general method by which those defects may be avoided. Absent from the prior art, however, is a disclosure of specific methods and materials by which mask edge defects may be avoided upon recrystallizing silicon semiconductor substrates which have been made amorphous through implanting of high doses of dopant ions.

SUMMARY OF THE INVENTION

A first object of the present invention is to provide a readily manufacturable field effect transistor structure which is not susceptible to MEDs at the junctures of gate spacer oxides of the transistor with recrystallized source/drain electrodes of the transistor.

A second object of the present invention is to provide a field effect transistor in accord with the first object of the present invention by means of modifying the penetration depth of dopant ions which make amorphous the source/drain electrodes of the transistor.

A third object of the present invention is to provide a field effect transistor in accord with the first and second objects of the present invention by means of varying the thickness of a screening layer through which source/drain electrode dopant ions must travel prior to reaching the silicon semiconductor substrate into which the ions are implanted.

In accord with the objects of the present invention, a new method for fabricating a field effect transistor which is not susceptible to MEDs at the juncture of its gate spacer oxide with recrystallized source/drain electrodes is described.

The method involves providing a (100) silicon semiconductor substrate having formed upon its surface a gate electrode aligned over a gate oxide. A pair of gate spacer oxides is then formed covering a pair of opposite edges of the gate oxide and the gate electrode. A screening layer is then formed over the surface of the semiconductor substrate, the gate electrode and the pair of gate spacer oxides. The top surface of the screening layer has an angle of elevation not exceeding 54.44 degrees with respect to the semiconductor substrate. The screening layer smoothly flows from a pair of higher thickness regions at the junctures of the gate spacer oxides and the semiconductor substrate to a pair of lower thickness regions over the semiconductor substrate. An ion implant is then provided to a prescribed penetration depth through the screening layer into the semiconductor substrate adjoining the gate spacer oxides to form a pair of amorphous source/drain electrodes. The prescribed penetration depth is greater in depth than the thickness of the screening layer over the semiconductor substrate and no greater in depth than the thickness of the screening layer at the juncture of the semiconductor substrate and the gate spacer oxides. Finally, the amorphous source/drain electrodes are annealed.

The transistor structure formed in accord with the present invention is readily manufacturable. It possesses a minimal number of additional process steps in comparison with field effect transistor structures which are known in the art. The additional process steps relate to formation and subsequent removal of the screening layer.

The screening layer of the present invention may be formed from several materials which have adequate characteristics to form the smooth flowing shape required for the present invention. The smooth flowing shape of the screening layer of the present invention provides a means by which a crescent shaped distribution of dopant ions may be introduced into the semiconductor substrate to form amorphous source/drain electrodes adjoining the gate spacer oxides.

Of the materials from which a screening layer may be formed two preferred embodiments are described in the present invention. In a first embodiment, the screening layer is formed from a silicon oxide layer formed through a Tetra Ethyl Ortho Silicate (TEOS) deposition process using ozone as an oxidant. In a second embodiment, the screening layer is formed from a doped glass layer. In the second embodiment, the doped glass layer must be removed prior to annealing the source/drain electrodes to prevent auto-doping of the amorphous source/drain electrodes upon recrystallization.

BRIEF DESCRIPTIONS OF THE DRAWINGS

The accompanying drawings, which form a material part of the invention described herein, show the following.

DESCRIPTION OF THE PREFERRED EMBODIMENTS

Figure 3:
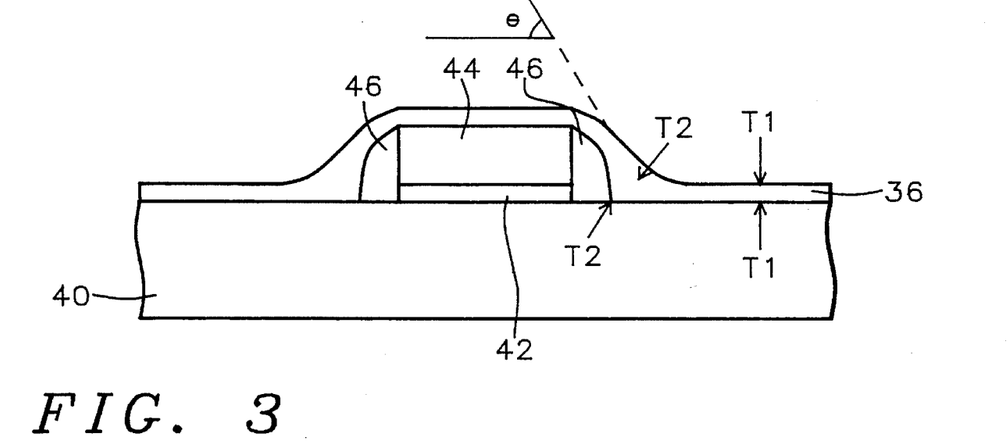
FIG. 3 shows a cross-sectional schematic diagram of a field effect transistor at the critical process step of the present invention.

Referring to FIG. 3, there is shown a schematic cross-sectional diagram of a transistor structure at the critical process step of the present invention. The critical process step of the present invention is the coating of a screening layer 36 over the surface of the gate spacer oxides 46, the gate electrode 44 and the semiconductor substrate 40 of the transistor structure of the present invention. This coating is done prior to implanting ions through the screening layer 36 to form amorphous source/drain electrodes within the semiconductor substrate 40 adjoining the gate spacer oxides 46.

The present invention may be practiced upon any field effect transistor known in the art, which transistor is fabricated upon a (100) silicon semiconductor substrate wafer, where a gate spacer oxide contacts the semiconductor substrate of the transistor structure at a sufficiently high angle of incidence such that gate spacer MEDs are formed within the semiconductor substrate adjoining the gate spacer oxides upon recrystallization of source/drain electrodes made amorphous through a high dose ion implant. The field effect transistors upon which the present invention may be practiced may have N doped source/drain electrodes or P doped source/drain electrodes. Alternatively, the field effect transistors upon which the present invention may be practiced may have alternating arrays of transistors having N doped source/drain electrodes and P doped source/drain electrodes. Typically, the field effect transistors upon which the present invention may be practiced will have N+ and/or P+ doped source/drain electrodes made amorphous through high dose ion implanting with arsenic, boron or phosphorus ions.

Referring again to FIG. 3, there are three parameters which define the critical dimensions of the screening layer 36 of the present invention. The first parameter is the minimum thickness of the screening layer 36 over the surface of the semiconductor substrate 40 which will be ion implanted to form the source/drain electrodes of the transistor of the present invention. This parameter is defined as T1 in FIG. 3. The second parameter is the maximum thickness of the screening layer 36 measured at the juncture of the gate spacer oxides 46 and the semiconductor substrate 40. This parameter is defined as T2 in FIG. 3. The last parameter is the maximum angle of elevation of the top surface of the screening layer 36 over the gate spacer oxides 46 as measured with reference to the semiconductor substrate 40 plane. This angle is defined as $\Theta$ in FIG. 3.

For the present invention, the parameters of the screening layer 36 must meet several conditions. First, the angle of elevation $\Theta$ must not exceed 54.44 degrees. This is the physically defined angle of inclination of the (111) crystallographic planes within the semiconductor substrate with reference to the (100) crystallographic planes which include the semiconductor substrate 40 surface. Next, the projection range of ions used to implant the amorphous source/drain electrodes of field effect transistors of the present invention must be greater than the minimum thickness T1 of the screening layer 36, but no greater than the maximum thickness T2 of the screening layer 36. Under these conditions, a crescent shaped distribution of implanting ions will be formed at the junctures of the gate spacer oxides 46 and the semiconductor substrate 40.

With regard to materials from which the screening layer 36 may be formed, it has been found that the above conditions may be met by direct deposition of a screen oxide layer derived from Tetra Ethyl Ortho Silicate (TEOS) deposited through an ozone oxidation process. Such transistor structures will comprise the first preferred embodiment of the present invention.

It is also possible to achieve the above conditions when the screening layer 36 is formed through reflow of a conformal doped glass screen layer. Doped glass screen layers may be formed through several Chemical Vapor Deposition (CVD) processes. Such transistor structures will comprise the second preferred embodiment of the present invention.

Figure 4A:
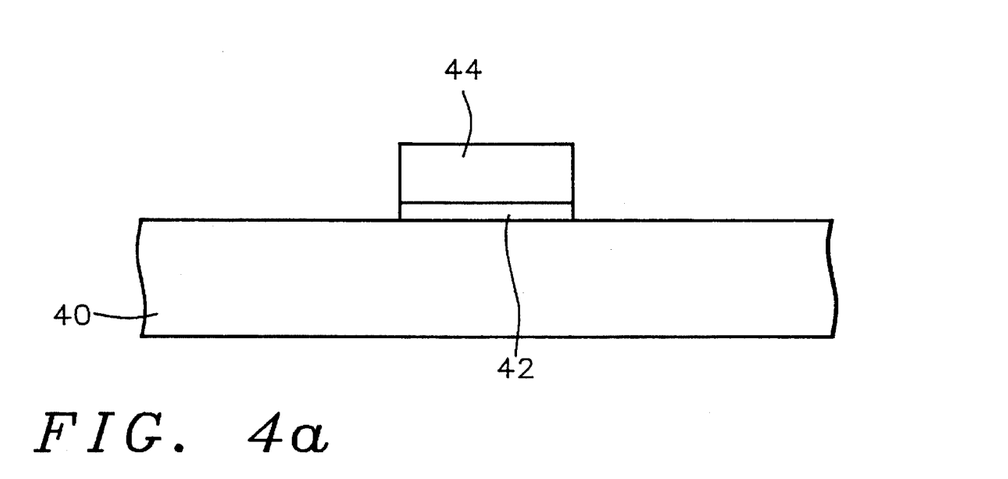
FIG. 4a to FIG. 4e show cross-sectional schematic diagrams of field effect transistor structures in accord with the first preferred embodiment of the present invention.

Referring now to FIG. 4a to FIG. 4e, there is shown a series of schematic cross-sectional diagrams corresponding to field effect transistor structures in accord with the first preferred embodiment of the present invention. FIG. 4a shows a schematic cross-sectional diagram of a semiconductor substrate 40 upon which is formed a gate oxide 42, and a gate electrode 44 formed over the gate oxide 42.

The formation and patterning of gate oxides are well known in the art. The gate oxide 42 may be formed through several processes, including but not limited to thermal oxidation of the silicon semiconductor substrate 40, Chemical Vapor Deposition (CVD) of organic or inorganic silicon oxide precursors and other methods which use energetic excitation to assist the deposition process. The preferred method for forming the gate oxide 42 of the first preferred embodiment of the present invention is through a thermal oxidation process to yield a typical gate oxide 42 thickness of about 75 to about 150 angstroms.

The forming of gate electrodes upon gate oxides is also common to the art of field effect transistors. The gate electrode 44 may be formed from several conductive materials, including but not limited to polysilicon, metals and metal alloys. These materials may be deposited through several methods as are known in the art, including but not limited to evaporative deposition processes, CVD processes and Plasma Enhanced Chemical Vapor Deposition (PECVD) processes. The preferred material for the gate electrode 44 of the first preferred embodiment of the present invention is a stacked tungsten silicide/polysilicon composition which is preferably formed through a Chemical Vapor Deposition (CVD) process to yield a typical gate electrode 44 thickness of about 4000 to about 5000 angstroms.

Figure 4B:
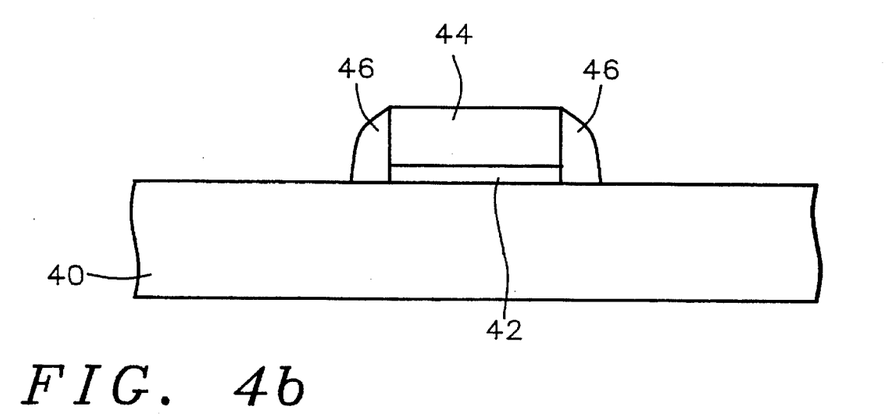

Referring now to FIG. 4b there is shown a schematic cross-sectional diagram of a field effect transistor structure illustrating the next process step in the formation of the field effect transistor of the first preferred embodiment of the present invention. Shown in FIG. 4b are a pair of gate spacer oxides 46 formed covering a pair of opposite edges of the gate electrode 44 and the gate oxide 42.

Forming gate spacer oxides is also well known in the art of field effect transistors. The gate spacer oxides 46 of the present invention may be formed through etching of a layer of deposited gate spacer oxide material. Methods of depositing a layer of gate spacer oxide material include but are not limited to CVD methods and Plasma Enhanced Chemical Vapor Deposition (PECVD) methods. Etching of the layer of gate spacer oxide material to form gate spacer oxides 46 may also be accomplished through several methods as are know in the art. Included are wet chemical etching methods, Reactive Ion Etching (RIE) methods, and magnetically assisted plasma etching methods. For the first preferred embodiment of the present invention, the gate spacer oxides 46 are preferably formed from a silicon oxide layer deposited through a Low Pressure Chemical Vapor Deposition (LPCVD) process using Tetra Ethyl Ortho Silicate (TEOS) as the silicon source material. The layer is preferably formed into the gate spacer oxides 46 through exposure to a Reactive Ion Etch (RIE) etching process.

Figure 4C:
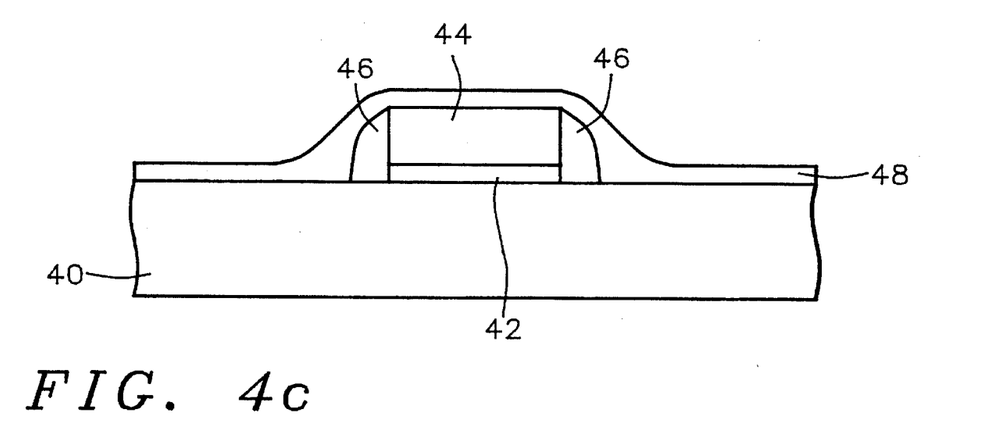

Referring now to FIG. 4c, there is shown a schematic cross-sectional diagram of a field effect transistor structure illustrating the next step in the first preferred embodiment of the present invention. FIG. 4c shows the formation of a screen oxide layer 48 over the surface of the transistor structure of the first preferred embodiment of the present invention. Covered by this screen oxide layer 48 are the semiconductor substrate 40, the gate electrode 44 and the gate spacer oxides 46. Forming the screen oxide layer 48 is a critical process to the first embodiment of the present invention.

The preferred method for forming the screen oxide layer 48 of the first preferred embodiment of the present invention is through a Plasma Enhanced Chemical Vapor Deposition (PECVD) process using TEOS as the silicon source material and ozone as the oxidant. Process parameters which are critical to formation of the screen oxide layer 48 of the present invention include the ozone concentration, the deposition temperature and the deposition rate. In particular, it is preferred that the ozone concentration be in the range of about 3 to about 6 percent by volume of the TEOS concentration. Using these process parameters, a screen oxide layer 48 is formed which meets the requirement that the maximum angle of elevation of the top surface or the screen oxide layer 48 over the gate spacer oxides 46 does not exceed 54.44 degrees. The screen oxide layer 48 formed through this process is preferably about 50 to about 500 angstroms thick at its thinner region over the semiconductor substrate 40, and about 200 to about 800 angstroms thick at its thicker region at the junctures of the gate spacer oxides 46 with the semiconductor substrate.

Figure 4D:
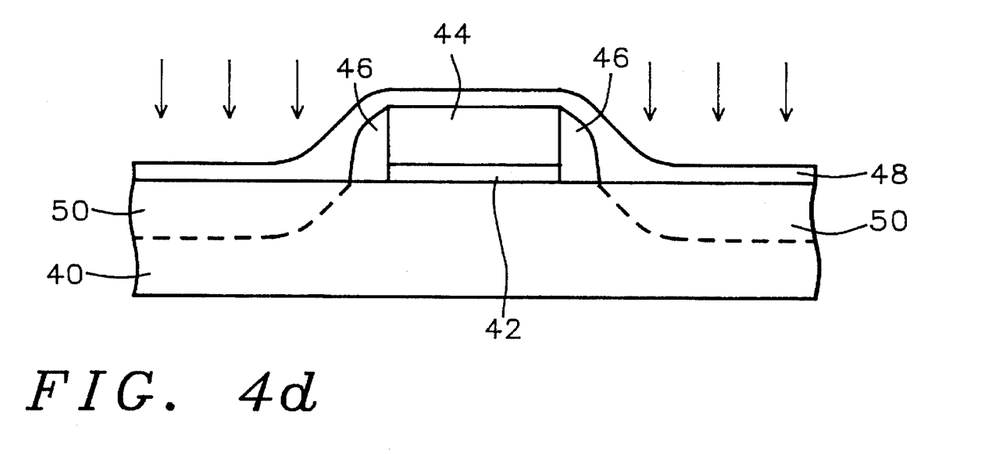

Referring now to FIG. 4d there is shown a cross-sectional schematic diagram of a field effect transistor structure in accord with the next process step of the first preferred embodiment of the present invention. FIG. 4d shows the results of an ion implantation process which forms amorphous source/drain electrodes 50 within the semiconductor substrate 40 adjoining the gate spacer oxides 46 beneath the screen oxide layer 48. For the present invention, the projection range of the implanted ions must be greater than the minimum thickness of the screen oxide layer 48 over the semiconductor substrate 40, and no greater than the maximum thickness of the screen oxide layer 48 at the juncture of the gate spacer oxides 46 and the semiconductor substrate 40. As a result of the curvature and thickness variation of the screen oxide layer 48, the implantation depth of the implanted ions into the semiconductor substrate 40 adjoining the gate spacer oxides 46 will have a crescent shape.

As is known in the art there are several ions which may be implanted into semiconductor substrates to form source/drain electrodes. Such ions include, but are not limited to boron ions, phosphorus ions and arsenic ions. Also well known in the art are the methods by which these ions may be accelerated and implanted into semiconductor substrates. The preferred ion for practice of the first embodiment of the present invention is arsenic ion. It is preferred to implant arsenic ions through the screen oxide layer 48 into the semiconductor substrate 40 adjoining the gate spacer oxides 46 at a dose of about 1E15 to about 1E16 ions per square centimeter and an ion implantation energy of about 40 to about 80 keV to form the amorphous source/drain electrodes 50 of the present invention. Under these conditions, the penetration depth of the arsenic ions is about 400 to about 800 angstroms.

Figure 4E:
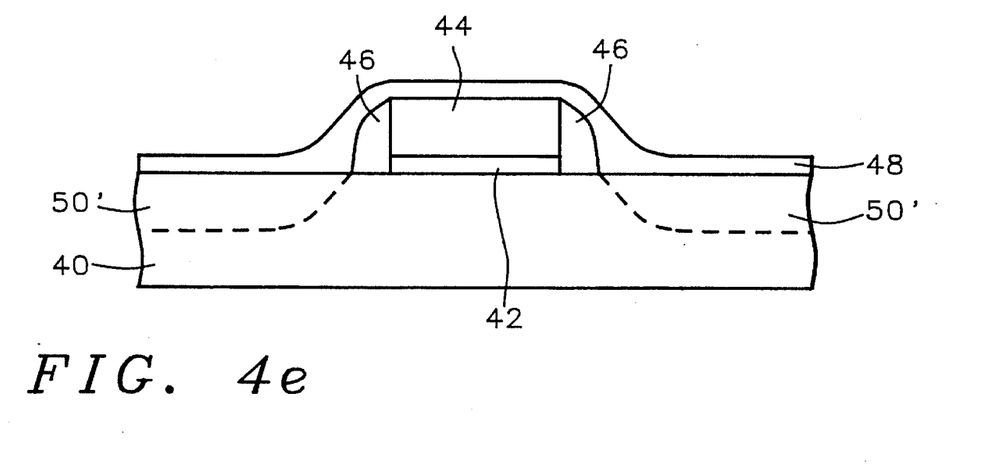

Referring now to FIG. 4e there is shown a cross-sectional diagram or a field effect transistor structure in accord with the fast process step of the first preferred embodiment of the present invention. FIG. 4e shows the result of annealing the amorphous source/drain electrodes 50 to form crystalline source/drain electrodes 50'. The preferred annealing conditions for the first preferred embodiment of the present invention are an annealing temperature of about 550 to about 900 degrees centigrade for a time period of about 30 to about 60 minutes. Upon annealing, the amorphous source/drain electrodes 50 recrystallize without the formation of gate spacer mask edge detects at the junctures or the gate spacer oxides 46 with the semiconductor substrate 40.

In addition to the first preferred embodiment of the present invention, there is also a second preferred embodiment of the present invention. The second preferred embodiment differs from the first preferred embodiment by replacing the screen oxide layer 48 in the first preferred embodiment with a doped glass screen layer such as Soro Phospho Silicate Glass (BPSG), Phospho Silicate Glass (PSG) or Boro Silicate Glass (BSG).

Figure 5A:
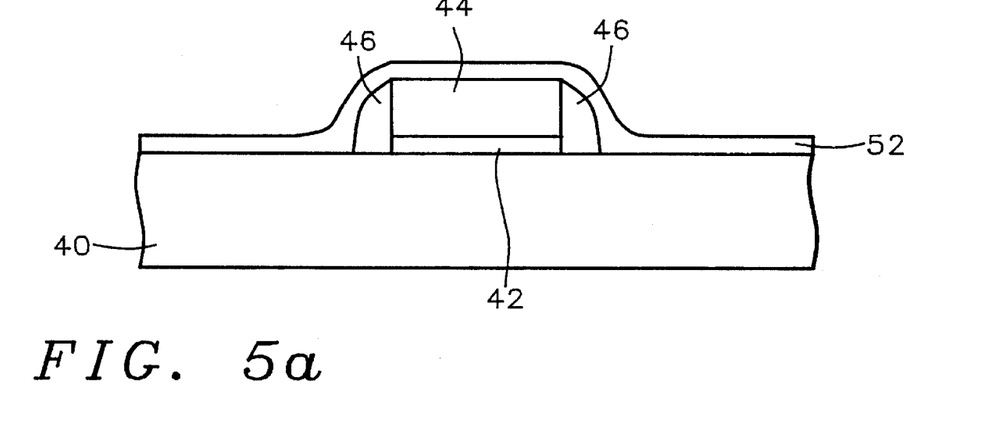
FIG. 5a to FIG. 5d show cross-sectional schematic diagrams of field effect transistor structures in accord with the second preferred embodiment of the present invention.

Referring now to FIG. 5a, there is shown a schematic cross-sectional diagram of a field effect transistor structure in accord with the second preferred embodiment of the present invention. FIG. 5a is analogous to FIG. 4c. The processing steps undertaken to arrive at the field effect transistor structure or FIG. 5a are the same as those corresponding to the processing steps or FIG. 4a to FIG. 4c. In FIG. 5a, a semiconductor substrate 40 having formed thereupon a gate oxide 42, gate electrode 44 and gate spacer oxides 46 now has a doped glass screen layer 52 rather than the screen oxide layer 48 of FIG. 4c. In comparison with the screen oxide layer 48 of FIG. 4c, the doped glass screen layer 52 may be reflowed under carefully controlled temperature conditions to achieve the geometric conditions required for the present invention.

Methods for forming doped glass layers are well known in the art. Such methods include, but are not limited to sputtering methods and CVD methods. The CVD methods may be undertaken at reduced pressures or atmospheric pressure. Some methods provide additional energetic plasma excitation. The doping of the doped glass screen layer 52 may be done in situ, or the doped glass screen layer 52 may be formed from a previously doped glass source material. For the doped glass screen layer 52 of the second preferred embodiment of the present invention, it is preferred that the doped glass screen layer 52 be formed from a BPSG glass layer deposited through an Atmospheric Pressure Chemical Vapor Deposition (APCVD) process. The APCVD process by which is formed the BPSG layer preferably employs diborane, phosphine, silane and oxygen as the source materials. The doped glass screen layer 52 is then reflowed by exposure to an elevated temperature or about 800 to about 900 degrees centigrade for about 10 to about 60 minutes. The doped glass screen layer 52 formed through this process is preferably about 50 to about 500 angstroms thick at its thinner region over the semiconductor substrate 40, and about 200 to about 800 angstroms thick at its thicker section at the junctures or the gate spacer oxides 46 with the semiconductor substrate.

Figure 5B:
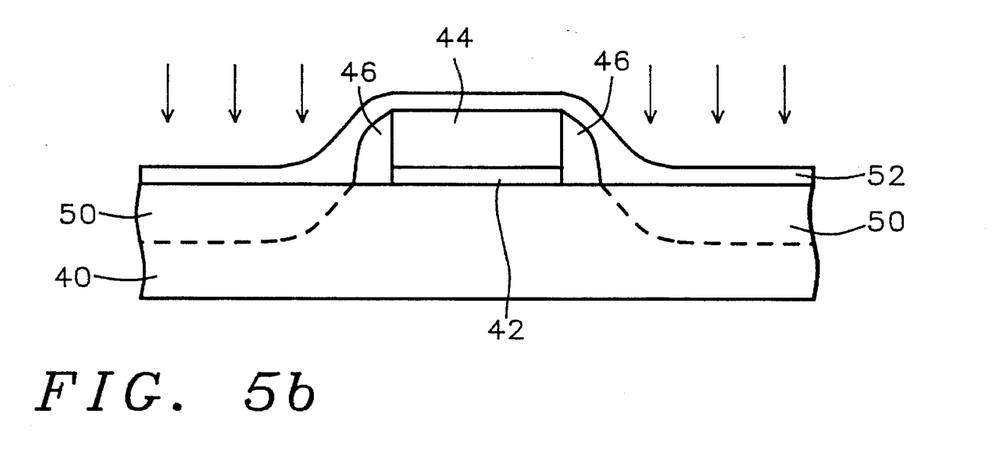

Referring now to FIG. 5b, there is shown a cross-sectional schematic diagram of a field effect transistor in accord with the next process step of the second preferred embodiment of the present invention. Shown in FIG. 5b is the ion implantation step to form amorphous source drain electrodes 50 within semiconductor substrate 40 adjoining gate spacer oxides 46. Ion implantation methods and materials for the second preferred embodiment of the present invention follow analogously from corresponding methods and materials from the first preferred embodiment of the present invention. For the second preferred embodiment of the present invention, the preferred implanting ion for forming the amorphous source/drain electrodes is arsenic ion implanted at about 1E15 to about 1E16 ions per square centimeter dose and about 40 to about 80 keV ion implantation energy. Under these conditions, the penetration depth of the arsenic ion is about 400 to about 800 angstroms.

Figure 5C:
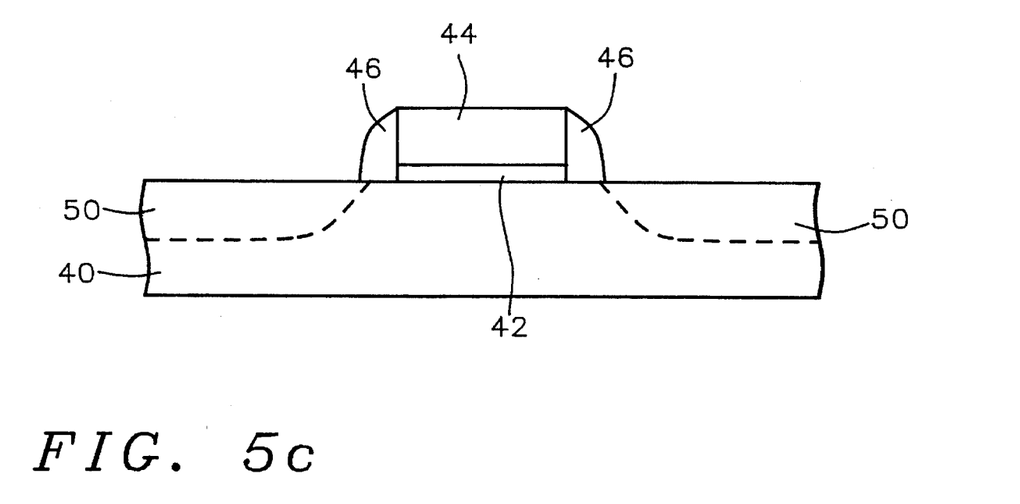

Referring now to FIG. 5c, there is shown a cross-sectional schematic diagram or a field effect transistor in accord with the next process step in the second preferred embodiment of the present invention. FIG. 5c shows the field effect transistor structure in FIG. 5b from which has been removed the doped glass screen layer 52. It is essential to practice of the second preferred embodiment of the present invention that the doped glass screen layer 52 be removed prior to annealing and recrystallizing the amorphous source/drain electrodes 50. Without removing the doped glass screen layer 52, there will be auto-doping of dopants from the doped glass screen layer 52 into the source/drain electrodes 50 at elevated temperature.

Methods for removing doped glass layers are well known in the art. Methods include, but are not limited to wet chemical etch methods, Reactive Ion Etch (RIE) methods and plasma assisted etch methods. The doped glass screen layer 52 of the present invention is preferably removed through a Reactive Ion Etch (RIE) process to yield the field effect transistor structure of FIG. 5c.

Figure 5D:
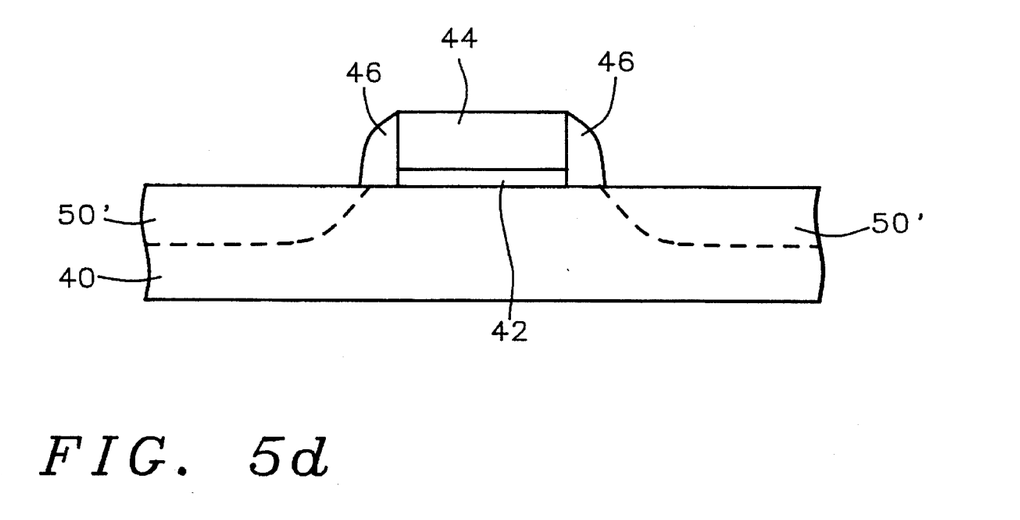

Referring now to FIG. 5d, there is shown a schematic cross-sectional diagram of a field effect transistor structure in accord with the last process step of the second preferred embodiment of the present invention. Show in FIG. 5d is the field effect transistor structure of FIG. 5c after the amorphous source/drain electrodes 50 have been annealed to form crystalline source/drain electrodes 50'. The requirements for the annealing process follow analogously from the first preferred embodiment of the present invention. The preferred annealing conditions for the second preferred embodiment of the present invention are an annealing temperature of about 550 to about 900 degrees centigrade for a time period of about 30 to about 60 minutes.

Analogously to the first preferred embodiment of the present invention, the second preferred embodiment also does not show gate spacer oxide MEDs upon annealing of the amorphous source/drain electrodes.

What is claimed is:

1. A method for forming a field effect transistor not susceptible to mask edge defects at its gate spacer oxide edges comprising:

providing a (100) silicon semiconductor substrate having formed thereupon a gate electrode aligned over a gate oxide;

forming a pair of gate spacer oxides covering a pair of opposite edges of the gate oxide and the gate electrode;

forming a screen oxide layer over the surface of the semiconductor substrate, the gate electrode and the pair of gate spacer oxides;

the upper surface of the screen oxide layer having an angle of elevation not exceeding 54.44 degrees with respect to the semiconductor substrate;

the screen oxide layer smoothly flowing from a pair of higher thickness regions at the junctures of the gate spacer oxides and the semiconductor substrate to a pair of lower thickness regions over the semiconductor substrate;

providing an ion implant to a prescribed penetration depth through the screen oxide layer into the semiconductor substrate adjoining the gate spacer oxides to form a pair of amorphous source/drain electrodes:

the prescribed penetration depth being greater in depth than the thickness of the screen oxide layer over the semiconductor substrate and no greater in depth than the thickness of the screen oxide layer at the junctures of the semiconductor substrate and the gate spacer oxides; and annealing the amorphous source/drain electrodes.

2. The method of claim 1 wherein the screen oxide layer is a silicon oxide layer formed from a TEOS silicon source material.

3. The method of claim 2 wherein the TEOS silicon source material is formed into the screen oxide layer through an ozone oxidation process.

4. The method of claim 3 wherein the ozone oxidation process is undertaken at about 3 to about 6 percent by volume ozone concentration with respect to TEOS silicon source material concentration.

5. The method of claim 1 wherein the pair of higher thickness regions has a maximum thickness of about 200 to about 800 angstroms each.

6. The method of claim 1 wherein the pair of lower thickness regions has a minimum thickness of about 50 to about 500 angstroms each.

7. The method of claim 1 wherein the prescribed penetration depth is about 400 to about 800 angstroms.

8. The method of claim 1 wherein the ion implant is an arsenic ion implant.

9. The method of claim 1 wherein the source/drain electrodes are annealed by exposure to an elevated temperature of about 550 to about 900 degrees centigrade for about 30 to about 60 minutes.

10. A method for forming a field effect transistor not susceptible to mask edge detects at its gate spacer oxide edges comprising:

providing a (100) silicon semiconductor substrate having formed thereupon a gate electrode aligned over a gate oxide;

forming a pair or gate spacer oxides covering a pair of opposite edges of the gate oxide and the gate electrode;

forming a doped glass screen layer over the surface of the semiconductor substrate, the gate electrode and the pair of gate spacer oxides;

the upper surface of the doped glass screen layer having an angle of elevation not exceeding 54.44 degrees with respect to the semiconductor substrate;

the doped glass screen layer smoothly flowing from a pair of higher thickness regions at the junctures of the gate spacer oxides and the semiconductor substrate to a pair of lower thickness regions over the semiconductor substrate;

providing an ion implant to a prescribed penetration depth through the doped glass screen layer into the semiconductor substrate adjoining the gate spacer oxides to form a pair of amorphous source/drain electrodes;

the prescribed penetration depth being greater in depth than the thickness of the doped glass screen layer over the semiconductor substrate and no greater in depth than the thickness of the doped glass screen layer at the juncture of the semiconductor substrate and the gate spacer oxides;

removing the doped glass screen layer; and annealing the amorphous source/drain electrodes.

11. The method of claim 10 wherein the doped glass screen layer is formed from a Boro Phospho Silicate Glass material.

12. The method of claim 11 wherein the Boro Phospho Silicate Glass material is formed through a deposition process employing diborane, phosphine, silane and oxygen as the source materials.

13. The method of claim 12 wherein the deposition process is an Atmospheric Pressure Chemical Vapor Deposition process.

14. The method of claim 10 wherein the pair of higher thickness regions has a maximum thickness of about 200 to about 800 angstroms each.

15. The method of claim 10 wherein the pair of lower thickness regions has a maximum thickness of about 50 to about 500 angstroms each.

16. The method of claim 10 wherein the prescribed penetration depth is about 400 to about 800 angstroms.

17. The method of claim 10 wherein time ion implant is an arsenic ion implant.

18. The method of claim 10 wherein the source/drain electrodes are annealed by exposure to an elevated temperature of about 550 to about 900 degrees centigrade for about 30 to about 60 minutes.

* * * * *